(12) United States Patent
Greene et al.

(10) Patent No.: US 7,932,744 B1
(45) Date of Patent: Apr. 26, 2011

(54) STAGGERED I/O GROUPS FOR INTEGRATED CIRCUITS

(75) Inventors: Jonathan W. Greene, Palo Alto, CA (US); Gregory W. Bakker, San Jose, CA (US); Suhail Zain, San Ramon, CA (US)

(73) Assignee: Actel Corporation, Mountain View, CA (US)

( * ) Notice: Subject to any disclaimer, the term of this patent is extended or adjusted under 35 U.S.C. 154(b) by 447 days.

(21) Appl. No.: 12/142,118

(22) Filed: Jun. 19, 2008

(51) Int. Cl.
*H03K 19/177* (2006.01)

(52) U.S. Cl. .......................................... 326/39; 326/101
(58) Field of Classification Search ............... 326/37–41, 326/101
See application file for complete search history.

(56) References Cited

U.S. PATENT DOCUMENTS

| | | | | |
|---|---|---|---|---|
| 5,838,627 A | * | 11/1998 | Tomishima et al. | 365/230.03 |
| 5,962,926 A | * | 10/1999 | Torres et al. | 257/786 |
| 6,717,270 B1 | | 4/2004 | Downey et al. | |
| 6,836,026 B1 | * | 12/2004 | Ali et al. | 257/786 |
| 2006/0022705 A1 | * | 2/2006 | Or-Bach et al. | 326/41 |
| 2006/0255477 A1 | * | 11/2006 | Kim et al. | 257/786 |

* cited by examiner

*Primary Examiner* — Don P Le
(74) *Attorney, Agent, or Firm* — Lewis and Roca LLP

(57) ABSTRACT

An I/O scheme for an integrated circuit includes a group layout cell. The group layout cell includes a plurality of signal I/O pads. A driver circuit is coupled to each signal I/O pad. The group layout cell also includes two I/O driver-circuit power-supply pads. ESD protection circuitry is coupled to the plurality of driver circuits. The signal I/O pads and the I/O driver-circuit power-supply pads are arranged in rows. The rows may be regular or staggered.

28 Claims, 5 Drawing Sheets

STAGGERED I/O GROUPS FOR INTEGRATED CIRCUITS

BACKGROUND OF THE INVENTION

1. Field of the Invention

The present invention relates to integrated circuit technology. More particularly, the present invention relates to input/output (I/O) architectures and layouts.

2. The Prior Art

Figure 1:
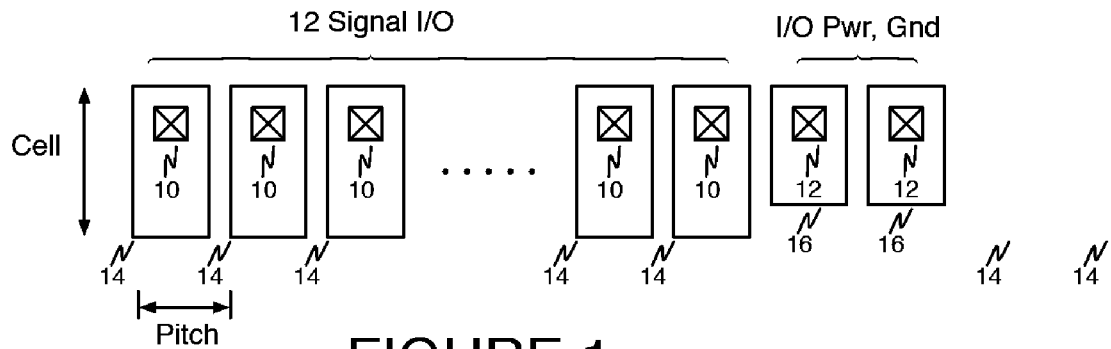

FIG. 1 shows a typical layout for a conventional inline I/O scheme. Pads 10 are used for signals, and pads 12 are used for the power supply and ground supply for the I/O drivers (referred to herein as I/O power and ground supply pads). Persons of ordinary skill in the art will appreciate that there may also be pads for other supplies (not shown) such as for the internal logic, but these are typically less numerous. For every twelve or so I/O signal pads 10, a pair of I/O power and ground supply pads 12 are required to maintain adequate stability on the power and ground supply lines. The exact number of signal pads per supply pad and the exact order of the pads around the perimeter of the chip may vary from that shown based on such considerations as the type of I/O standard supported, the nature of the internal logic on the chip, the fabrication technology, the type of package, or other factors.

Each signal I/O pad is associated with a corresponding I/O cell 14. The I/O cells 14 include the driver circuitry to drive the I/O pad 10, and may also include some electrostatic-discharge protection (ESD) circuitry. Each I/O power and ground pad 12 is also associated with a corresponding cell 16 as well. These cells 16 might include ESD circuitry, bypass capacitors, or other circuitry as is known in the art. The diagrams indicate the desired location of the pads, but the size of the pads may be smaller or larger relative to the size of the cell than is shown.

The pads 10 and 12 in FIG. 1 are shown placed over the active cell circuitry in the corresponding cells 14 and 16, which is currently the preferred implementation. This is not necessarily the case in older technologies, where they may be placed adjacent to the cells along the perimeter of the chip. The pitch, or spacing along the perimeter of the chip, between adjacent pads for this inline layout is labeled Pi. A typical inline pitch might be 47 um, but this may vary depending on the fabrication technology, type of package, or other factors. The effective pitch per signal pad, which includes an amortized portion of the perimeter adjacent to the supply pads, would be (12+2)×47 um/12=54.8 um in this example.

Figure 2:
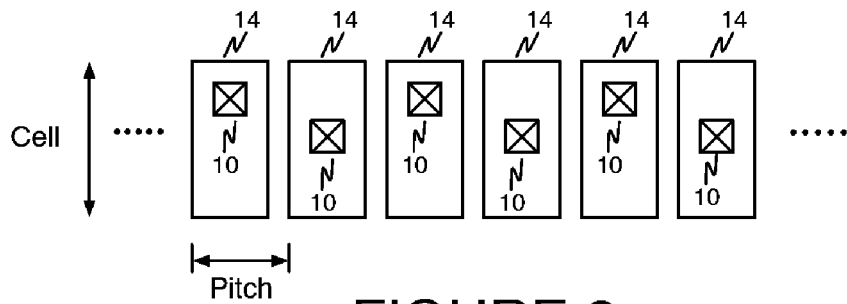

FIG. 2 shows a conventional staggered I/O scheme. By arranging the pads 10 on alternating I/O cells 14 in two staggered rows, the pitch can be reduced. A typical pitch in a scheme such as that shown in FIG. 2 might be 35 um. The area of each I/O cell is about the same as it is in the inline I/O schemes, provided the pads may be placed over active circuitry. (If this is not possible, the cells might be a bit larger.) The number of power-supply pads per signal pad would be about the same as with inline I/O schemes. The effective pitch per signal pad would be (12+2)×35 um/12=40.8 um in this example.

U.S. Pat. No. 6,717,270 discloses a power-ground embedded (PGE) I/O scheme. In this system, bond pads are arranged in a pair configuration. Each pair is part of an I/O cell. The inner pads of a bond pad pair are signal pads for carrying I/O signals to and/or from the die. The outer bond pads are supply pads (either power or ground) for coupling the IC die to either a ground ring or a VDD power ring located on the package substrate. Outer (power supply) bond pads are configured alternately as power pads and ground pads around the IC die periphery.

Utilizing a pad that is selectively couplable to multiple conductive structures in a two pad I/O cell may provide for a die with greater utilization of die space, thereby allowing for the possibility of more I/O cells per IC die. In some instances, one pad may be coupled to a signal and the second pad may be selectively coupled to either a power or ground conductor, thereby allowing for a single I/O pad cell which incorporates either a power or ground pad to maximize flexibility for power and ground placement in a bank of I/O cells. The effective pitch of the signal I/O cells is reduced because separate power-supply cells are no longer required. For example, if the typical inline pitch of 47 um is used between adjacent I/O cells, the effective pitch is exactly the same, 47 um. This compares favorably with the effective pitch of 54.8 um for the conventional inline scheme of FIG. 1. Also, there are many more supply pads per signal pad (a 1:1 ratio for the PGE scheme vs. a 2:12 ratio for the conventional schemes). This contributes to providing a more stable voltage level on the supply lines on the chip than is possible with the conventional schemes. However the effective pitch is worse than that of a conventional staggered I/O scheme like that of FIG. 2 in that not as many I/Os fit around a chip of a given perimeter. This may be seen from an examination of the TABLE below.

In the example set forth in the TABLE, it is assumed that for every 12 signal pads provided, one power supply and one ground supply pad will be necessary. This makes a total of 2 supply pads for every 12 signal pads. (To keep the comparison simple any additional supply pads required for internal logic, etc. are ignored) Normally each supply pad needs its own I/O cell. With PGE, these separate power-supply and ground-supply pads are eliminated by embedding a power-supply pad or ground-supply into each signal I/O cell.

TABLE

| Scheme | Signal Pads | Separate Supply Pads | Embedded Supply Pads | Total Perimeter Required | Effective Pitch per Signal Pad | Total Supply Pads per Signal Pad |
| --- | --- | --- | --- | --- | --- | --- |
| Inline | 12 | 2 | 0 | 47 × 14 = 658 | 54.8 | 2/12 |
| Staggered | 12 | 2 | 0 | 35 × 14 = 490 | 40.8 | 2/12 |
| PGE | 12 | 0 | 12 | 47 × 12 = 564 | 47 | 12/12 |
| Staggered Group (FIG. 4) | 12 | 0 | 6 | 47 × 3 × (12/4) = 423 | 35.3 | 6/12 |
| Staggered Group (FIG. 5) | 12 | 0 | 6 | (2 × 35 + 2 × 47) × (12/4) = 492 | 41.0 | 6/12 |

Because the PGE scheme already uses two rows of pads, one for signals and one for supplies, it does not lend itself to staggering pads. Adding a third or fourth row of pads would require another vertical layer of bonding wires, and additional complexity in the integrated circuit package.

BRIEF DESCRIPTION OF THE INVENTION

A group layout cell includes a plurality of signal I/O pads. A driver circuit is coupled to each signal I/O pad. The group layout cell also includes two I/O driver-circuit supply pads, one for power and one for ground. ESD protection circuitry is coupled to the plurality of driver circuits. The signal I/O pads and the I/O driver-circuit supply pads are arranged in rows. The rows may be aligned or staggered, and successive pads in a row equally spaced or not.

BRIEF DESCRIPTION OF THE DRAWING FIGURES

Figure 3:
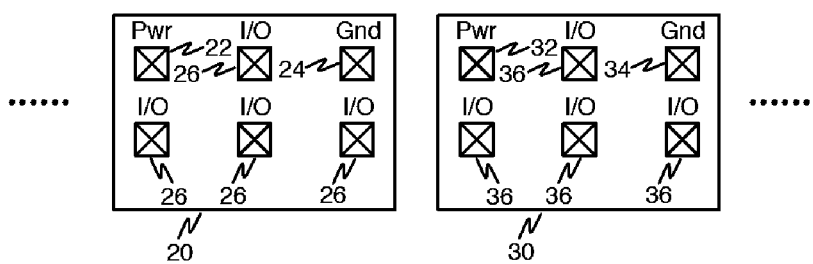
Figure 4:
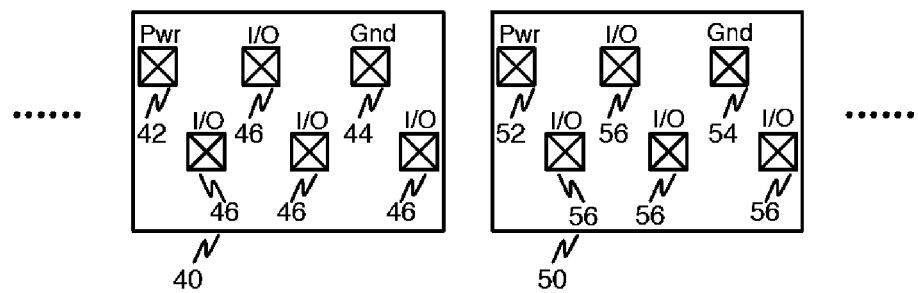
Figure 5:
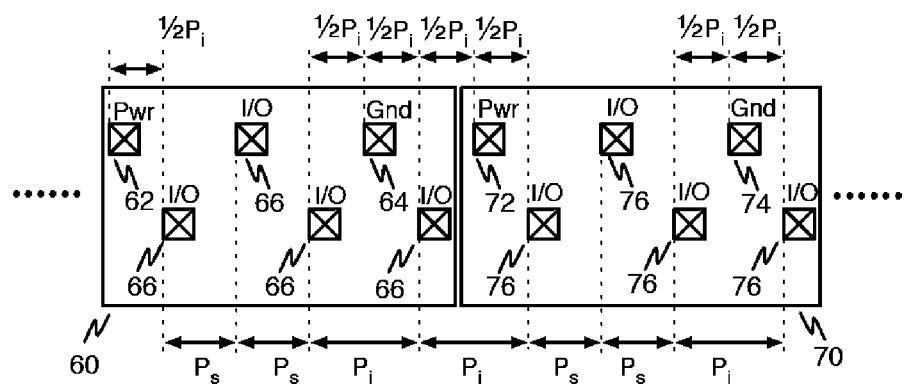
Figure 6:
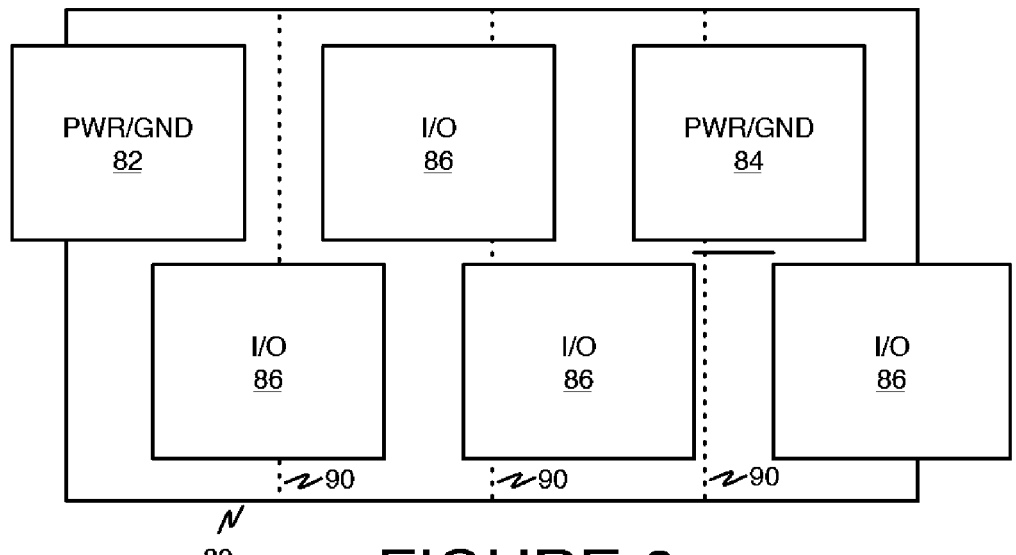
Figure 7A:
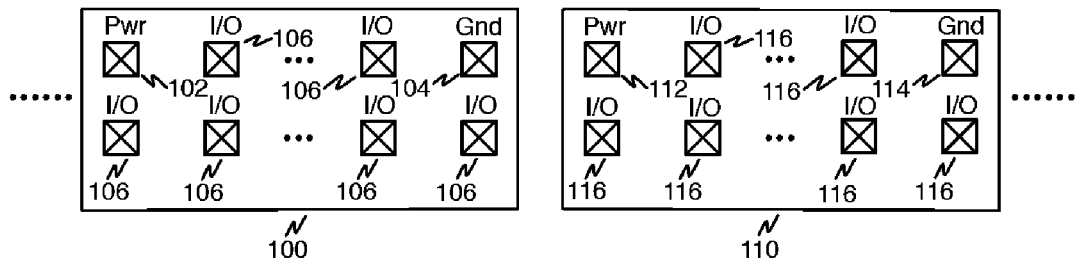
Figure 7B:
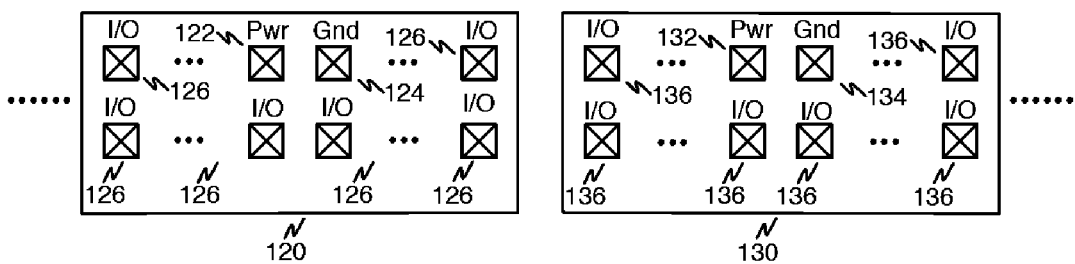
Figure 7C:
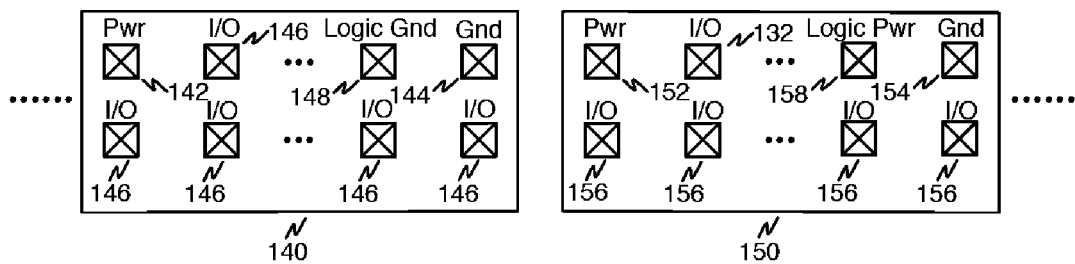

FIG. 1 is a diagram of a prior-art I/O layout scheme.
FIG. 2 is a diagram of another prior-art I/O layout scheme.
FIG. 3 is a diagram of an illustrative I/O layout scheme according to the present invention.
FIG. 4 is a diagram of another illustrative I/O layout scheme according to the present invention.
FIG. 5 is a diagram of another illustrative I/O layout scheme according to the present invention.
FIG. 6 is a diagram of another illustrative I/O layout scheme according to the present invention.
FIGS. 7A through 7C are diagrams of other illustrative I/O layout schemes according to the present invention.
FIGS. 8A through 8D are diagrams of other illustrative I/O layout schemes according to the present invention.
FIGS. 9A and 9B are diagrams of I/O other illustrative layout schemes according to the present invention.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Referring now to FIG. 3, a diagram shows an I/O layout scheme according to one aspect of the present invention. A number of signal pads (here four), a number of supply pads (here two; one power and one ground), and the corresponding circuitry for drivers, ESD protection, etc. are combined and laid out as a group. A first I/O group layout cell 20 includes power supply pad 22, ground pad 24, and four signal pads 26. I/O group layout cell 20 also includes the driver circuits for signal pads 26 and ESD protection circuitry to protect the signal and supply pads 22, 24, and 26. The pads 22, 24, and 26 are arranged in two aligned rows.

A second I/O group layout cell 30 includes I/O power supply pad 32, I/O ground pad 34, and four I/O signal pads 36. I/O group layout cell 30 also includes the driver circuits for signal pads 36 and ESD protection circuitry to protect the signal and supply pads 32, 34, and 36. The pads 32, 34, and 36 are arranged in two regular rows. Group layout cells 20 and 30 may be constructed and spaced so that the constituent pads in each row are spaced apart from one another by the same pitch as the individual prior-art I/O cells shown in the inline scheme of FIG. 1.

The area of the group layout cells 20 and 30 would be approximately the same as that of four individual I/O cells in the PGE scheme. The effective pitch per signal may be computed as follows. Using the typical inline pitch of 47 um, each group layout cell has a total width of 3×47 um=141 um. Dividing by the number of signal pads, an effective pitch of 141/4=35.25 um is obtained, about the same as the conventional staggered I/O scheme of FIG. 2. Since this is slightly larger than the typical staggered pitch of 35 um, it should still be possible to connect the signal pads to the corresponding connections on the package substrate with bonding wires. Compared to the conventional staggered scheme, there are many more supply pads per signal pad, 2/4=0.5 for FIG. 3 vs. 2/12 for the conventional schemes of FIGS. 1 and 2. Although the 1:1 ratio of supply to signal pads of the PGE scheme is not matched, a ratio of 1:1 is often needlessly high for maintenance of stable voltages on the supply lines. Thus the scheme of the present invention obtains a better tradeoff of improved signal pad density around the perimeter without sacrificing supply voltage stability.

Referring now to FIG. 4, a diagram shows another I/O layout scheme according to the present invention wherein the I/O pads are staggered in a manner similar to the conventional staggered layout of FIG. 2. A first I/O group layout cell 40 includes power supply pad 42, ground pad 44, and three signal pads 46. I/O group layout cell 40 also includes the driver circuits for signal pads 46 and ESD protection circuitry to protect the signal pads 46. The pads 42, 44, and 46 are arranged in two rows, but unlike the embodiment of FIG. 3, the rows are staggered. By staggering the pads in this way, it becomes easier to connect the bonding wires to the pads when there is a signal pad in the outer ring; the bonding wires for nearby signal pads in the outer and inner rings are less likely to interfere with each other.

A second I/O group layout cell 50 includes power supply pad 52, ground pad 54, and three signal pads 56. I/O cell 50 also includes the driver circuits for signal pads 56 and ESD protection circuitry to protect the signal pads 56. The pads 52, 54, and 56 are also arranged in two staggered rows. Group layout cells 40 and 50 may be constructed and spaced so that the constituent pads in each row are spaced apart from one another by the same pitch as the individual prior-art I/O cells shown in the inline scheme of FIG. 1. With a typical inline pitch of 47 um, the effective pitch per signal pad is still the same as in FIG. 3, 35.25 um.

Referring now to FIG. 5, a diagram shows another alternative pad layout in accordance with the present invention. A first I/O group layout cell 60 includes power supply pad 62, ground pad 64, and three signal pads 66. I/O group layout cell 60 also includes the driver circuits for signal pads 66 and ESD protection circuitry to protect the signal pads 66. The pads 62, 64, and 66 are arranged in two rows, and like the embodiment of FIG. 4, the rows are staggered.

A second I/O group layout cell 70 includes power supply pad 72, ground pad 74, and three signal pads 76. I/O cell 70 also includes the driver circuits for signal pads 76 and ESD protection circuitry to protect the signal pads 76. The pads 72, 74, and 76 are also arranged in two staggered rows.

Persons of ordinary skill in the art will observe that, in this scheme, adjacent pads in each row are not necessarily spaced equidistant from each other. $P_s$ refers to a staggered pitch, typically 35 um. $P_i$ refers to an inline pitch, typically 47 um. These spacings are chosen conservatively to insure that the pitch between adjacent signal pads are the same or larger than those between similarly situated pads in the conventional inline or staggered schemes, guaranteeing that there should be no difficulty in positioning the wire bonds. Adjacent signal pads in different rows are spaced according to the staggered pitch, while adjacent signal pads in the same row are spaced according to the inline pitch. The effective pitch per signal may be computed as follows. Using an inline pitch of 47 um and a staggered pitch of 35 um, each group layout cell has a total width of $2 \times P_s + 2 \times P_i = 164$ um. Dividing by the number of signal pads, four, an effective pitch of 164/4=41 um is obtained. This is only slightly larger than the effective pitch of the conventional staggered scheme, 40.8 um, yet the advantage of having a much better ratio of supply to signal pads is retained.

Referring now to FIG. 6, a diagram shows one version of the scheme of FIG. 4 with some additional layout details. Group layout cell 80 includes power supply pad 82, ground pad 84, and four signal pads 86. I/O group layout cell 80 also includes the driver circuits for I/O signal pads 86 and ESD protection circuitry to protect the signal and supply pads 82, 86, and 88. Like the embodiment shown in FIG. 4, the pads 82, 84, and 86 in the group layout cell 80 of FIG. 6 are arranged in two regular rows. Whereas in FIG. 4, the driver, ESD, and other circuitry may be laid out as one group in an arbitrarily intermingled and optimized fashion, FIG. 6 shows that it may also be laid out by constructing a cell containing the driver circuit for one signal pad and a proportional amount of the ESD circuitry, and then repeating this cell once for each signal pad (four times). Dashed lines 90 indicate where the boundaries of four individual I/O cells would be. In an illustrative embodiment using the typical pitches, the cell pitch (for individual cells) is equal to the effective pitch per signal pad of 35.25 um and the pitch between adjacent pads in the same row is 47 um. Persons of ordinary skill in the art will appreciate that the exact dimensions of the pitches could be varied to suit the fabrication technology. FIG. 6 also gives a more realistic picture of the size of the pads themselves (not just their location as in the earlier drawings). In the prior art (and even with the prior art PGE layout), the pitch of the signal pads and the pitch of the driver circuits match. Here the pitch of the driver circuits is larger than the pitch of the signal pads. Pitch is measured between adjacent signal pads even if they are in different rows, e.g., $P_s$ in FIG. 5.

Compared to the PGE prior art described herein, which has one power supply pad and one ground supply pad for each signal pad, the number of I/O power supply and ground supply pads in this embodiment of the invention is reduced to two (one power, one ground) for every four signal pads. While this does reduce the maximum number of possible power and ground supply pads that may be bonded out to the package, two supply pads per four signal pads is still more than adequate to maintain good stability of the supply voltages on chip.

The present invention has been disclosed using the choice of grouping four signal pads and two power and ground supply pads into a single group layout cell. This implementation works satisfactorily for 90 nm CMOS technology. However layout cell groups with other numbers and proportions of signal and supply pads are contemplated within the scope of the present invention, in which there is no intention to limit the invention to the disclosed embodiments.

By grouping multiple signal pads and one or more supply pads into a single larger group layout cell, the present invention attains or even improves upon the tight pitch of a prior-art staggered pad scheme, while still matching the area and supply stability benefits of a prior-art PGE scheme.

Referring now to FIG. 7A, a diagram illustrates an additional, more general, I/O layout scheme embodiment of the present invention. Like the embodiment shown in FIG. 3, the I/O cell embodiment of FIG. 7A includes two rows. A plurality of signal pads, a plurality of I/O supply pads, and the corresponding circuitry for drivers, ESD protection, etc. are combined and laid out as an I/O group. A first I/O group layout cell 100 includes I/O power supply pad 102, I/O ground pad 104, and a plurality of signal pads 106. I/O group layout cell 100 also includes the driver circuits for signal pads 106 and ESD protection circuitry to protect the signal and supply pads 102, 104, and 106. In the embodiment shown in FIG. 7A, the pads 102, 104, and 106 are arranged in two aligned rows.

A second I/O group layout cell 110 includes I/O power supply pad 112, I/O ground pad 114, and a plurality of I/O signal pads 116. I/O group layout cell 110 also includes the driver circuits for signal pads 116 and ESD protection circuitry to protect the signal and supply pads 112, 114, and 116. The pads 112, 114, and 116 are arranged in two regular rows. Group layout cells 100 and 110 may be constructed and spaced so that the constituent pads in each row are spaced apart from one another by the same pitch as the individual prior-art I/O cells shown in the inline scheme of FIG. 1. In a preferred embodiment, the layout of groups 100 and 110 would be identical. Or the layout of each group might be chosen from a small set of alternatives, for example two different layouts used in alternation. The group layout of FIG. 7A differs from that of FIG. 3 in that numbers of signal pads other than four are provided in each group. This permits the ratio of signal to I/O supply pads to be chosen appropriately for the needs of a particular application.

Referring now to FIG. 7B, a diagram illustrates another more general I/O layout scheme embodiment of the present invention. Like the embodiment shown in FIG. 3, the I/O cell embodiment of FIG. 7B includes two rows. A plurality of signal pads, a plurality of I/O supply pads, and the corresponding circuitry for drivers, ESD protection, etc. are combined and laid out as an I/O group. A first I/O group layout cell 120 includes I/O power supply pad 122, I/O ground pad 124, and a plurality of signal pads 126. I/O group layout cell 120 also includes the driver circuits for signal pads 126 and ESD protection circuitry to protect the signal and supply pads 122, 124, and 126. In the embodiment shown in FIG. 7B, the pads 122, 124, and 126 are arranged in two aligned rows.

A second I/O group layout cell 130 includes I/O power supply pad 132, I/O ground pad 134, and a plurality of I/O signal pads 136. I/O group layout cell 130 also includes the driver circuits for signal pads 136 and ESD protection circuitry to protect the signal and supply pads 132, 134, and 136. The pads 132, 134, and 136 are arranged in two regular rows. Group layout cells 120 and 130 may be constructed and spaced so that the constituent pads in each row are spaced apart from one another by the same pitch as the individual prior-art I/O cells shown in the inline scheme of FIG. 1. As may be seen from an examination of FIG. 7B, the I/O power and ground pads 122 and 124 are disposed in the center of the I/O group cells 120 and 130 instead of at their edges as shown in FIG. 7A. These pads could be located at the edges, at the center or anywhere within the group layout cell that is most convenient for the particular driver and ESD circuitry to be laid out underneath.

Referring now to FIG. 7C, a diagram illustrates another more general I/O layout scheme embodiment of the present invention. Like the embodiment shown in FIG. 3, the I/O group cell embodiment of FIG. 7C includes two rows. A plurality of signal pads, a plurality of I/O supply pads, and the corresponding circuitry for drivers, ESD protection, etc. are combined and laid out as an I/O group. A first I/O group layout cell 140 includes I/O power supply pad 142, I/O ground pad 144, and a plurality of signal pads 146. I/O group layout cell 140 also includes the driver circuits for signal pads 146 and ESD protection circuitry to protect the signal and supply pads 122, 144, and 146. In the embodiment shown in FIG. 7C, the pads 142, 144, and 146 are arranged in two aligned rows.

A second I/O group layout cell 150 includes I/O power supply pad 152, I/O ground pad 134, and a plurality of I/O signal pads 136. I/O group layout cell 150 also includes the driver circuits for signal pads 156 and ESD protection circuitry to protect the signal and supply pads 152, 154, and 156. The pads 152, 154, and 156 are arranged in two regular rows. Group layout cells 140 and 150 may be constructed and spaced so that the constituent pads in each row are spaced apart from one another by the same pitch as the individual prior-art I/O cells shown in the inline scheme of FIG. 1.

The embodiment shown in FIG. 7C differs from the embodiments shown in FIGS. 7A and 7B in that special supply pads 148 and 158 are substituted for some of the signal I/O pads 146 and 156 in cells 140 and 150. The special supply pads may provide additional power or ground supplies for circuitry other than the I/O drivers, such as logic circuitry in the core of the integrated circuit or particular circuit blocks such as phase-locked-loops (PLLs) that require their own low-noise supply pad. The embodiment of FIG. 7C is shown having the I/O power and ground pads 142, 144, 152, and 154 at the edges of cells 140 and 150 similar to the arrangement of FIG. 7A, although persons of ordinary skill in the art will appreciate that I/O power and ground pads could be disposed in the center of the I/O group cells 140 and 150 as shown in FIG. 7B.

The embodiments of FIGS. 7A through 7C have the same advantages of the embodiment of FIG. 3. The area of the group layout cells 100, 110, 120, 130, 140, and 150 would be less than the total area of a number of individual I/O cells in the PGE scheme sufficient to provide the same number of signal pads. The effective pitch per signal may be computed as follows. Let $N_{sig}$ be the number of signal pads in a group. Let $N_{sup}$ be the number of I/O supply pads in a group. (In FIG. 3, $N_{sig}$ is 4 and $N_{sup}$ is 2). Using the typical inline pitch of 47 um, each group layout cell has a total width of $(½) \times (N_{sig} + N_{sup}) \times 47$ um. Dividing by the number of signal pads $N_{sig}$, an effective pitch of $(½) \times (N_{sig} + N_{sup}) \times 47$ um/$N_{sig}$ per signal pad is obtained. The effective pitch per signal pad can be reduced below that of FIG. 3, yet more I/O supply pads can be provided per signal pad compared to the conventional schemes of FIGS. 1 and 2. By adjusting the values of $N_{sig}$ and $N_{sup}$, the scheme of FIGS. 7A-7C can provide a more flexible tradeoff of improved signal pad density around the perimeter without sacrificing supply voltage stability.

Figure 8A:
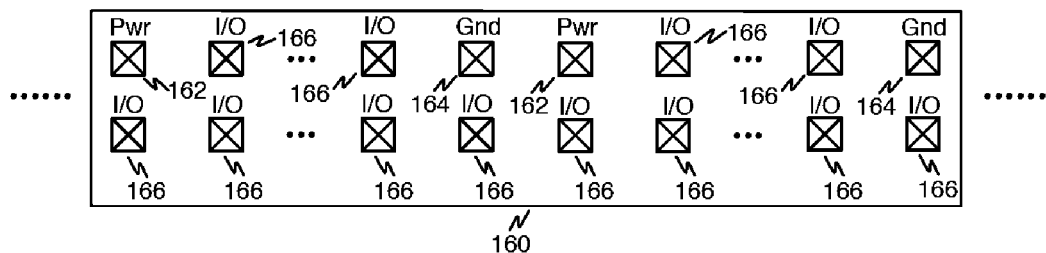
Figure 8B:
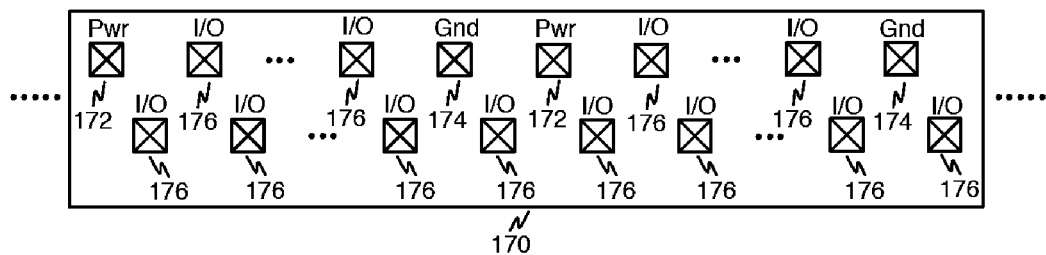
Figure 9A:
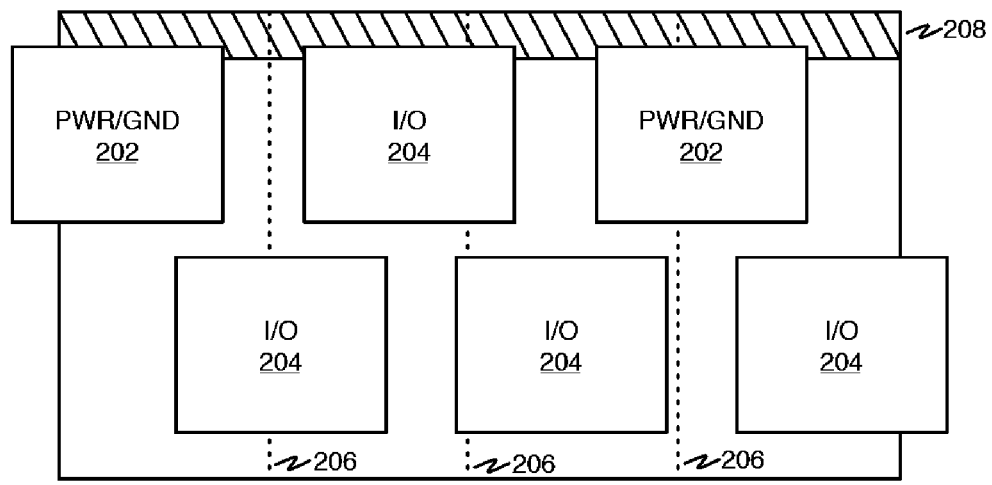
Figure 9B:
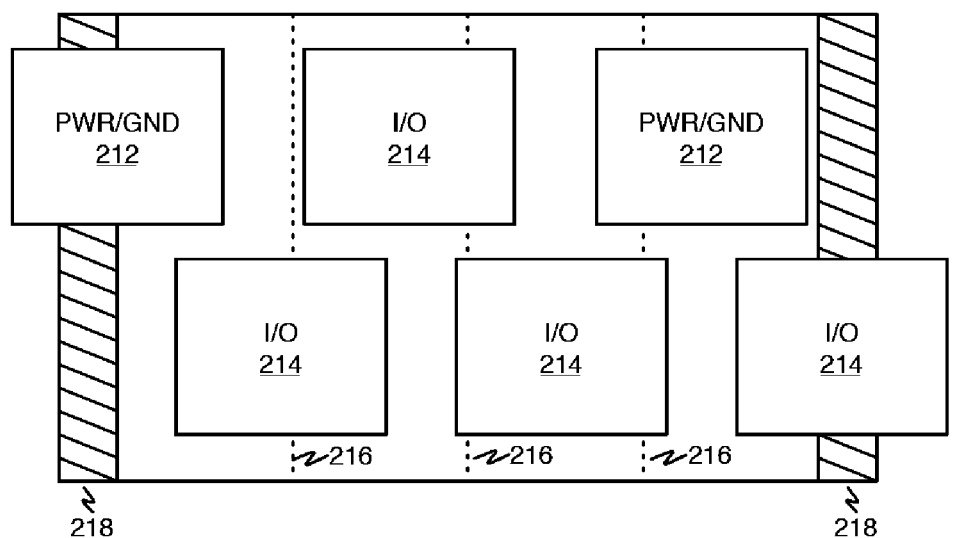

Referring now to FIGS. 8A and 8B, additional more general I/O layout scheme embodiments of the present invention. In FIG. 8A, a diagram illustrates an additional, more general, I/O layout scheme embodiment of the present invention. Like the embodiments shown in FIGS. 3 and 7A-7C, the I/O group cell embodiment of FIG. 8A includes two rows. A plurality of signal pads, a plurality of I/O supply pads, and the corresponding circuitry for drivers, ESD protection, etc. are combined and laid out as an I/O group. An I/O group layout cell 160 includes I/O power supply pad 162, I/O ground pad 164, and a plurality of signal pads 166. I/O group layout cell 160 also includes the driver circuits for signal pads 166 and ESD protection circuitry to protect the signal and supply pads 162, 164, and 166. As in the embodiments shown in FIGS. 3, and 7A-7C, the pads 162, 164, and 166 are arranged in two aligned rows.

The I/O cell 160 in FIG. 8A differs from the I/O cells shown in FIGS. 7A through 7C in that multiple I/O power and ground pads 162 and 164 are disposed in the I/O group cell 160 (making $N_{sup}$ greater than two). While FIG. 8A shows two pairs of I/O power and ground pads 162 and 164, persons of ordinary skill in the art will appreciate that more than two pairs of power and ground I/O pads 162 and 164 may be provided.

Referring now to FIG. 8B, an additional more general I/O layout scheme embodiment of the present invention is illustrated. The embodiment of FIG. 8B is similar in most respects to that of FIG. 8A, except that the I/O pads in the two rows are staggered from one another rather than aligned with each other. An I/O group layout cell 170 includes power supply pad 172, ground pad 174, and a plurality of signal pads 176. I/O group layout cell 170 also includes the driver circuits for signal pads 176 and ESD protection circuitry to protect the signal and supply pads 172, 174, and 176. In the embodiment shown in FIG. 8A, the pads 162, 164, and 166 are shown arranged in two aligned rows. In the embodiment shown in FIG. 8B, the I/O pads 172, 174, and 176 in the two rows are staggered from one another. The staggered layout of FIG. 8B can also be employed using the numbers of pads shown in FIGS. 7A-7C.

Figure 8C:
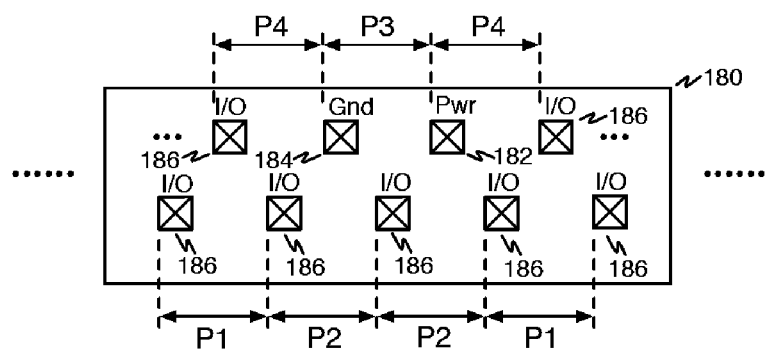

Referring now to FIG. 8C, another aspect of an I/O group layout scheme according to the present invention is illustrated. In FIG. 8C, I/O group cell 180 includes two rows of I/O pads. I/O cell 180 includes I/O power supply pad 182, I/O ground pad 184, and a plurality of signal pads 186. I/O group layout cell 180 also includes the driver circuits for signal pads 186 and ESD protection circuitry to protect the signal and supply pads 182, 184, and 186.

In the embodiment of FIG. 8C, the pitches of the various cells are different in a manner similar to that shown in FIG. 5. The pitch P1 is the pitch from signal pad to signal pad with a signal pad between them in the adjacent row. The pitch P2 is the pitch from signal pad to signal pad with a supply pad between them in the adjacent row. The pitch P3 is the pitch from supply pad to supply pad with a supply pad between them in the adjacent row. Finally, the pitch P4 is the pitch from supply pad to supply pad with a signal pad between them in the adjacent row. At least three of pitches P1, P2, P3, and P4 are different from one another.

Figure 8D:
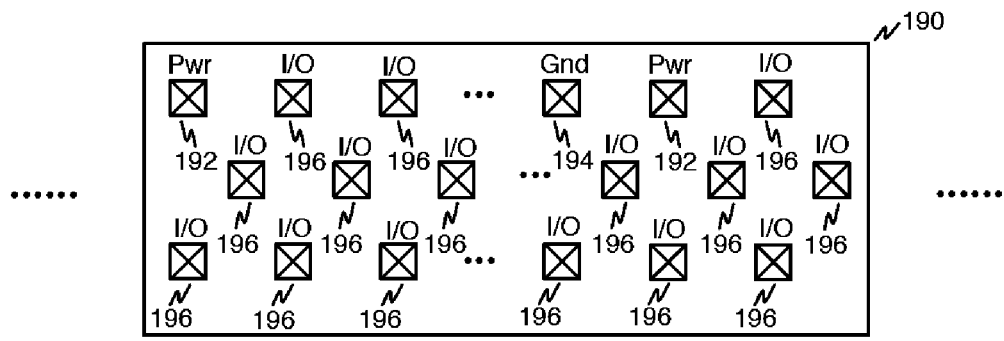

Referring now to FIG. 8D, another aspect of an I/O layout scheme according to the present invention is illustrated. In FIG. 8D, an I/O cell 190 is shown having three rows of I/O pads. The I/O pads in adjacent rows are staggered from one another I/O cell 190 includes I/O cell 180 includes power supply pad 192, ground pad 194, and a plurality of signal pads 196. I/O group layout cell 190 also includes the driver circuits for signal pads 196 and ESD protection circuitry to protect the signal and supply pads 192, 194, and 196. The outermost row of I/O pads includes the power supply pad 192, ground pad 194, and a plurality of signal pads 196. The two inner rows of I/O pads include signal I/O pads 196. The pitches of the I/O pads in the three rows may be uniform or may be different as shown in FIG. 8C.

Referring now to FIG. 9A, another aspect of an I/O layout scheme according to the present invention is illustrated. The group layout cell 200 shown in FIG. 9A includes IO power and ground supply pads 202 and four signal pads 204. I/O group layout cell 200 also includes the driver circuits for I/O signal pads 204. Like the embodiment shown in FIG. 4, the pads 202 and 204 in the group layout cell 200 of FIG. 9A are arranged in two regular rows. Whereas in FIG. 4, the driver, ESD, and other circuitry may be laid out as one group in an arbitrarily intermingled and optimized fashion, FIG. 9A, like FIG. 6, shows that it may also be laid out by constructing a cell containing the driver circuit for one signal pad, and then repeating this cell once for each signal pad (four times).

Dashed lines 206 indicate where the boundaries of four individual I/O driver cells would be.

In an illustrative embodiment using the typical pitches, the cell pitch (for individual cells) is equal to the effective pitch per signal pad of 35.25 um and the pitch between adjacent pads in the same row is 47 um. Persons of ordinary skill in the art will appreciate that the exact dimensions of the pitches could be varied to suit the fabrication technology. FIG. 9A also gives a more realistic picture of the size of the pads themselves (not just their location as in the earlier drawings). In prior art (and even with prior art PGE layout), the pitch of the signal pads and the pitch of the driver circuits match. As in FIG. 6, the pitch of the driver circuits in the embodiment of FIG. 9A is larger than the pitch of the signal pads. A difference from the embodiment of FIG. 6 is that specialty circuits 208, such as ESD protection circuitry to protect the signal and supply pads 202 and 204, are disposed along the outer edge of the I/O cell 200 adjacent to and in a direction parallel to the edge of the integrated circuit.

Referring now to FIG. 9B, another aspect of an I/O layout scheme according to the present invention is illustrated. The group layout cell 210 shown in FIG. 9B includes IO power and ground supply pads 212 and four signal pads 214. I/O group layout cell 200 also includes the driver circuits for signal pads 214. Like the embodiment shown in FIGS. 4 and 9A, the pads 212 and 214 in the group layout cell 210 of FIG. 9B are arranged in two regular rows. FIG. 9B also shows that a cell may be fabricated containing the driver circuit for one signal pad, and then repeating this cell once for each signal pad (four times). Dashed lines 206 indicate where the boundaries of four individual I/O driver cells would be.

In FIG. 9B, the specialty circuits 218 have been moved to the left and right edges of the I/O group cell, perpendicular to the edge of the integrated circuit. This requires a slight reduction in the pitch of the I/O driver cell to retain the desired overall width of the I/O group cell, aligning with the pads. Persons of ordinary skill in the art will appreciate that the exact dimensions of the pitches could be varied to suit the fabrication technology. FIG. 9B also gives a more realistic picture of the size of the pads themselves (not just their location as in the earlier drawings). In prior art arrangements (even with prior art PGE layout), the pitch of the signal pads and the pitch of the driver circuits match. The pitch of the driver circuits in the embodiment shown in FIG. 9B is still expected to be larger than the pitch of the signal pads.

Among the advantages of the present invention is that it accommodates a larger number of signal I/O pads in a chip of limited perimeter. Compared to the prior art, it also may reduce the total area for I/O cells. If each I/O cell is laid out individually as in the conventional schemes, there is often some wasted area adjacent to the supply pads. In the PGE scheme, extra circuitry may be required because of the surfeit of supply pads, and because the circuitry for each pair of signal and supply pads is still laid out as an individual unit. In some embodiments of the present invention it is possible to achieve additional layout efficiency because the circuitry for a number of signal and supply pads may be laid out together as an integrated group cell rather than separate cells each associated with a single signal pads. In addition, the present invention allows the flexibility to provide an adequate number of power and ground pads to stabilize I/O supply voltages without wasting scarce chip perimeter on excess supply pads.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A layout for an I/O scheme for an integrated circuit including:
    a group layout cell including:
        a plurality of bonding pads including at least one supply pad and a plurality of signal I/O pads;
        a plurality of I/O cells, each I/O cell including an I/O driver circuit, each I/O cell connected to at least one of the plurality of signal I/O pads;
        the I/O cells having a pitch that is larger than a pitch of the bonding pads.

2. The layout of claim 1 wherein the bonding pads are arranged in two rows.

3. The layout of claim 2 wherein the bonding pads in the two rows are aligned with one another and the pitch of the bonding pads is the periodicity of two adjacent bonding pads in one row divided by the number of rows.

4. The layout of claim 2 wherein the bonding pads in the two rows are staggered from one another.

5. The layout of claim 4 wherein adjacent signal I/O pads that are in the same row are spaced according to an inline pitch and adjacent signal I/O pads that are in different rows are spaced according to a staggered pitch, the inline pitch being greater than the staggered pitch.

6. The layout of claim 5 wherein the inline pitch is about 47 um and the staggered pitch is about 35 um.

7. The layout of claim 5 wherein adjacent signal I/O pads and supply pads that are in different rows are spaced according to about one half of the inline pitch.

8. The layout of claim 1 wherein the plurality of signal I/O pads includes four signal I/O pads.

9. The layout of claim 8 wherein the plurality of signal I/O pads and the two supply pads are arranged in two rows.

10. The layout of claim 9 wherein the two rows of bonding pads are aligned with one another and the pitch of the bonding pads is the periodicity of two adjacent bonding pads in one row divided by the number of rows.

11. The layout of claim 9 wherein the two rows of bonding pads are staggered from one another.

12. The layout of claim 1 wherein the at least one supply pad includes two I/O driver-circuit supply pads.

13. The layout of claim 1 where the I/O scheme is a wire-bonding I/O scheme.

14. A layout for an I/O scheme for an integrated circuit including:
    a first group layout cell having a plurality of signal I/O pads, a plurality of driver circuits, one driver circuit coupled to each signal I/O pad, and two I/O driver-circuit power supply pads, the plurality of signal I/O pads and the two I/O driver-circuit supply pads arranged in two rows;
    a second group layout cell having a plurality of signal I/O pads, a plurality of driver circuits, one driver circuit coupled to each signal I/O pad, and two I/O driver-circuit supply pads, the plurality of signal I/O pads and the two I/O driver-circuit supply pads arranged in two rows;
    wherein the two rows of bonding pads in both the first group layout cell and the second group layout cell are staggered from one another, adjacent signal I/O pads that are in the same row are spaced according to an inline pitch and adjacent signal I/O pads that are in different rows are spaced according to a staggered pitch, the inline pitch being greater than the staggered pitch, and adjacent signal I/O pads that are in corresponding rows of the first and second group layout cells are spaced according to the inline pitch.

15. A layout of claim 14, wherein adjacent supply pads in corresponding rows of the first and second group layout cells are spaced according to the inline pitch.

16. A layout for an I/O scheme for an integrated circuit including:
- a group-cell area in the integrated circuit defining a group layout cell including:
  - a plurality of bonding pads disposed substantially within the group-cell area and including at least one supply pad and a plurality of signal I/O pads; and
  - a plurality of I/O cells, each I/O cell having an identical size and shape and disposed under the bonding pads, the plurality of I/O cells occupying all of the group-cell area, each I/O cell connected to at least one of the plurality of signal I/O pads, each of the plurality of signal I/O pads connected to only one of the I/O cells; and
  - circuitry within the group layout cell, the circuitry including an I/O driver circuit for each I/O cell and ESD protection circuitry for each bonding pad, the circuitry entirely disposed within the I/O cells.

17. The layout of claim 16 wherein the bonding pads are arranged in two rows.

18. The layout of claim 17 wherein the bonding pads in the two rows are aligned with one another.

19. The layout of claim 17 wherein the bonding pads in the two rows are staggered from one another.

20. The layout of claim 16 wherein the plurality of signal I/O pads includes four signal I/O pads.

21. The layout of claim 20 wherein the plurality of signal I/O pads and the two supply pads are arranged in two rows.

22. The layout of claim 21 wherein the two rows of bonding pads are aligned with one another.

23. A layout for an I/O scheme for an integrated circuit including:
- a group layout cell including:
  - a plurality of wire-bonding pads including at least one supply pad and a plurality of signal I/O pads;
  - a plurality of I/O cells, each I/O cell including an I/O driver circuit, each I/O cell connected to at least one of the plurality of signal I/O pads;
  - wherein a position along an edge of the integrated circuit die of an I/O cell relative to a position along the edge of an I/O signal pad associated with the I/O cell varies from one I/O cell to another.

24. A layout for an I/O scheme for an integrated circuit including:
- a group layout cell including:
  - a plurality of wire-bonding pads including at least one supply pad and a plurality of signal I/O pads;
  - a plurality of I/O cells, each I/O cell including an I/O driver circuit, each I/O cell connected to at least one of the plurality of signal I/O pads;
  - wherein the I/O cells have a minimum pitch that is larger than a minimum pitch of the signal I/O pads.

25. A layout for an I/O scheme for an integrated circuit including:
- a group layout cell including:
  - a plurality of wire-bonding pads including at least one supply pad and a plurality of signal I/O pads, a ratio of supply pads to signal I/O pads is not equal to 1;
  - a plurality of I/O cells, each I/O cell including an I/O driver circuit, each I/O cell connected to at least one of the plurality of signal I/O pads;
  - wherein the I/O cells have a uniform pitch that is an integer multiple of an effective pitch of the signal I/O pads.

26. A layout for an I/O scheme for an integrated circuit including:
- a group layout cell including:
  - a plurality of wire-bonding pads including at least one I/O supply pad and a plurality of signal I/O pads, the number of I/O supply pads being half the total number of wire-bonding pads;
  - a plurality of I/O cells, each I/O cell including an I/O driver circuit, each I/O cell connected to at least one of the plurality of signal I/O pads;
  - wherein the I/O cells have a uniform pitch that is an integer multiple of an effective pitch of the signal I/O pads.

27. A layout for an I/O scheme for an integrated circuit including:
- a group layout cell including:
  - a plurality of wire-bonding pads including at least one supply pad and a plurality of signal I/O pads, the wire-bonding pads arranged in at least three two rows;
  - a plurality of I/O cells, each I/O cell including an I/O driver circuit, each I/O cell connected to at least one of the plurality of signal I/O pads;
  - wherein the I/O cells have a uniform pitch that is an integer multiple of an effective pitch of the signal I/O pads.

28. A layout for an I/O scheme for an integrated circuit including:
- a group layout cell including:
  - a plurality of wire-bonding pads including at least one I/O supply pad and a plurality of signal I/O pads, the wire-bonding pads arranged in at least two rows in which the wire bonding pads are staggered in adjacent rows;
  - a plurality of I/O cells, each I/O cell including an I/O driver circuit, each I/O cell connected to at least one of the plurality of signal I/O pads;
  - wherein the I/O cells have a uniform pitch that is an integer multiple of an effective pitch of the signal I/O pads.

* * * * *